United States Patent
Li et al.

(10) Patent No.: US 9,576,801 B2
(45) Date of Patent: Feb. 21, 2017

(54) HIGH DIELECTRIC CONSTANT/METAL GATE (HK/MG) COMPATIBLE FLOATING GATE (FG)/FERROELECTRIC DIPOLE NON-VOLATILE MEMORY

(71) Applicant: QUALCOMM Incorporated, San Diego, CA (US)

(72) Inventors: Xia Li, San Diego, CA (US); Jeffrey Junhao Xu, San Diego, CA (US); Zhongze Wang, San Diego, CA (US); Bin Yang, San Diego, CA (US); Xiaonan Chen, San Diego, CA (US); Yu Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/556,983

(22) Filed: Dec. 1, 2014

(65) Prior Publication Data
US 2016/0155748 A1    Jun. 2, 2016

(51) Int. Cl.
*H01L 27/11*    (2006.01)
*H01L 29/78*    (2006.01)
(Continued)

(52) U.S. Cl.
CPC ... *H01L 21/28088* (2013.01); *H01L 21/02181* (2013.01); *H01L 21/28273* (2013.01); *H01L 21/28291* (2013.01); *H01L 29/4966* (2013.01); *H01L 29/516* (2013.01); *H01L 29/517* (2013.01); *H01L 29/6684* (2013.01); *H01L 29/66545* (2013.01); *H01L 29/66795* (2013.01); *H01L 29/66825* (2013.01); *H01L 29/7851* (2013.01); *H01L 29/7883* (2013.01); *H01L 29/78391* (2014.09); *G11C 16/0408* (2013.01)

(58) Field of Classification Search
CPC ............... H01L 27/11521; H01L 27/11526; H01L 29/78391; H01L 29/4966; H01L 29/516; H01L 29/517; H01L 29/66795; H01L 29/66825; H01L 29/6684; H01L 29/7851; H01L 29/7883
See application file for complete search history.

(56) References Cited

U.S. PATENT DOCUMENTS 7,636,257 B2 * 12/2009 Lue .................... G11C 16/0475
                                                    365/185.05
7,709,359 B2    5/2010 Boescke et al.
(Continued)

OTHER PUBLICATIONS

Boscke T.S., et al., "Ferroelectricity in Hafnium Oxide: CMOS compatible Ferroelectric Field Effect Transistors," IEEE International Electron Devices Meeting (IEDM), 2011, pp. 24.5.1-24.5.4.
(Continued)

*Primary Examiner* — Ida M Soward
(74) *Attorney, Agent, or Firm* — Muncy, Geissler, Olds & Lowe, P.C.

(57) ABSTRACT

Non-volatile memory devices and logic devices are fabricated using processes compatible with high dielectric constant/metal gate (HK/MG) processes for increased cell density and larger scale integration. A doped oxide layer, such as a silicon-doped hafnium oxide ($HfO_2$) layer, is implemented as a ferroelectric dipole layer in a nonvolatile memory device.

24 Claims, 14 Drawing Sheets

(51) Int. Cl.
*H01L 29/66* (2006.01)
*H01L 29/51* (2006.01)
*H01L 29/49* (2006.01)
*H01L 21/28* (2006.01)
*H01L 29/788* (2006.01)
*H01L 21/02* (2006.01)
*G11C 16/04* (2006.01)

(56) References Cited

U.S. PATENT DOCUMENTS

| | | | | |
|---|---|---|---|---|
| 7,763,927 | B2 * | 7/2010 | Wu | H01L 21/28282 257/314 |
| 7,989,871 | B2 * | 8/2011 | Yasuda | H01L 21/28273 257/315 |
| 8,268,711 | B2 * | 9/2012 | Lee | B82Y 10/00 438/257 |
| 8,320,192 | B2 * | 11/2012 | Akil | G11C 16/0466 365/184 |
| 8,476,690 | B2 * | 7/2013 | Hagishima | H01L 27/11521 257/314 |
| 8,772,858 | B2 * | 7/2014 | Hsu | H01L 27/115 257/324 |
| 2003/0180976 | A1 * | 9/2003 | Janos | H01L 21/268 438/22 |
| 2008/0304320 | A1 * | 12/2008 | Wu | G11C 16/0475 365/185.03 |
| 2009/0045452 | A1 * | 2/2009 | Lue | G11C 16/0466 257/321 |
| 2009/0146201 | A1 * | 6/2009 | Zheng | H01L 29/7883 257/314 |
| 2009/0242957 | A1 * | 10/2009 | Ma | H01L 21/28273 257/316 |
| 2009/0294832 | A1 | 12/2009 | Kakoschke et al. | |
| 2010/0024732 | A1 * | 2/2010 | Mokhlesi | C23C 16/308 118/724 |
| 2010/0163952 | A1 | 7/2010 | Jan et al. | |
| 2011/0003452 | A1 * | 1/2011 | Lai | G11C 8/10 438/287 |
| 2012/0139029 | A1 * | 6/2012 | Yaegashi | H01L 21/28273 257/324 |
| 2013/0056836 | A1 | 3/2013 | Yu et al. | |
| 2013/0175604 | A1 | 7/2013 | Polishchuk et al. | |
| 2013/0270619 | A1 | 10/2013 | Schloesser et al. | |
| 2014/0183649 | A1 | 7/2014 | Lee et al. | |
| 2014/0239373 | A1 | 8/2014 | Murakoshi et al. | |
| 2015/0187587 | A1 * | 7/2015 | Hsieh | H01L 21/02164 438/585 |
| 2016/0064398 | A1 * | 3/2016 | Toh | H01L 27/11524 257/316 |
| 2016/0104801 | A1 * | 4/2016 | Zhu | H01L 29/66795 365/185.25 |

OTHER PUBLICATIONS

Schroeder U., et al., "Non-volatile data storage in HfO2-based ferroelectric FETs," 12th Annual Non-Volatile Memory Technology Symposium (NVMTS), 2012, pp. 60-63.

Partial International Search Report—PCT/US2015/062092—ISA/EPO—Mar. 22, 2016.

Boscke T.S., et al., "Phase Transitions in Ferroelectric Silicon Doped Hafnium Oxide", Applied Physics Letters, vol. 99, No. 11, Sep. 12, 2011 (Sep. 12, 2011), pp. 112904-112904, XP012151378, ISSN: 0003-6951, DOI: 10.1063/1.3636434, [retrieved on Sep. 15, 2011].

International Search Report and Written Opinion—PCT/US2015/062092—ISA/EPO—Jul. 5, 2016.

Koji K., et al., "Origin of Electric Dipoles Formed at High-k/SiO2 Interface", Applied Physics Letters, AIP Publishing LLC, US, vol. 94, No. 13, Apr. 1, 2009 (Apr. 1, 2009), pp. 132902-132902, XP012120704, ISSN: 0003-6951, DOI: 10.1063/1.3110968 the whole document.

Lomenzo P.D., et al., "The Effects of Layering in Ferroelectric Si-Doped HfO2 Thin Films", Applied Physics Letters, vol. 105, No. 7, Aug. 18, 2014 (Aug. 18, 2014), p. 072906, XP055282673, US, ISSN: 0003-6951, DOI: 10.1063/1.4893738.

* cited by examiner

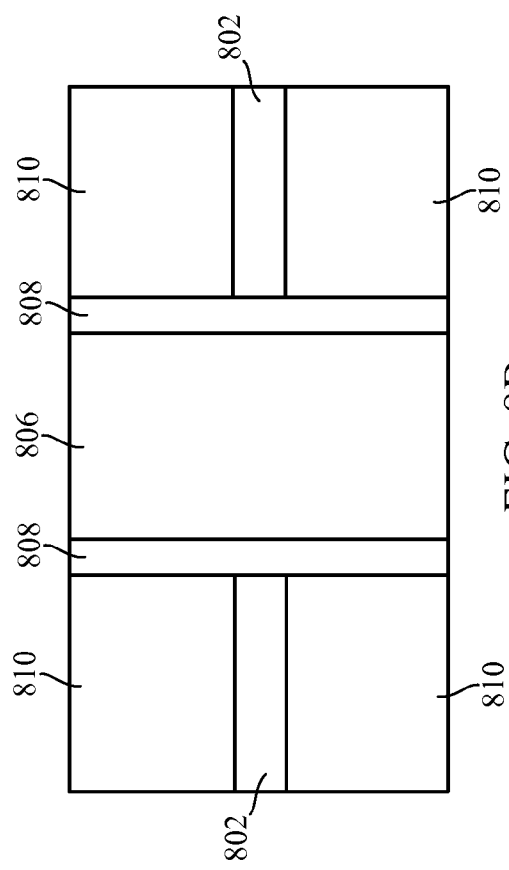
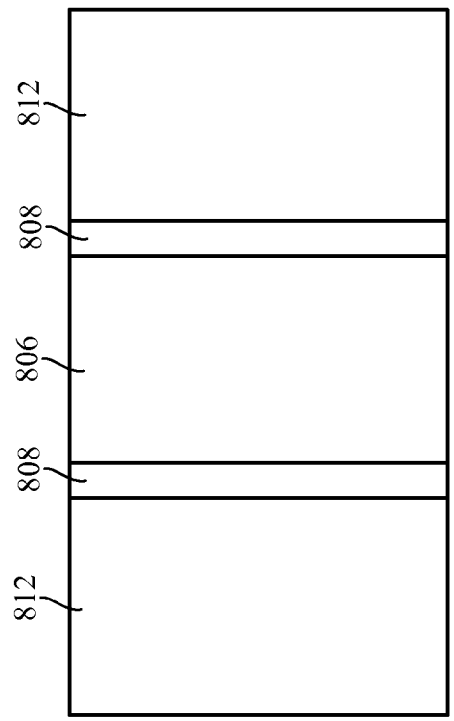
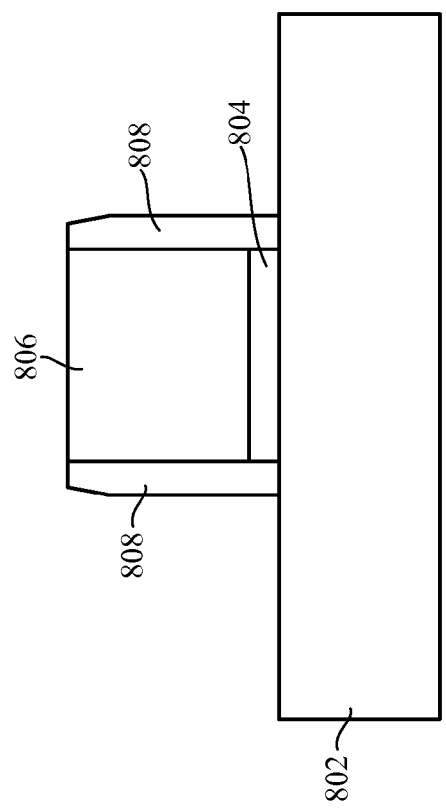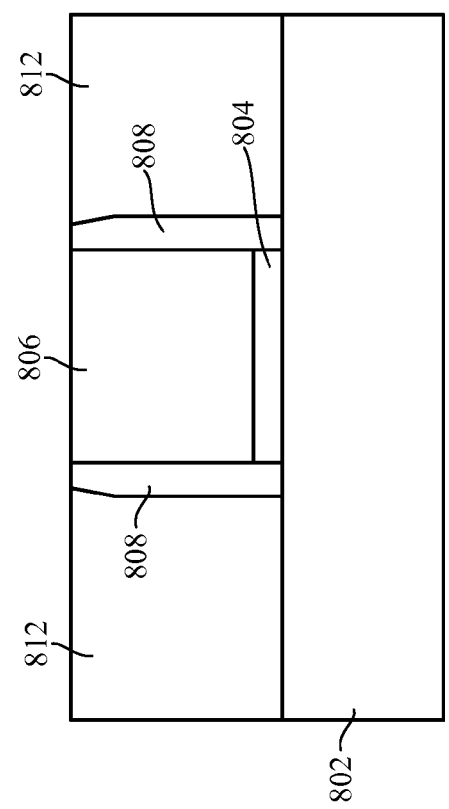
FIG. 8A
FIG. 8B
FIG. 9A
FIG. 9B

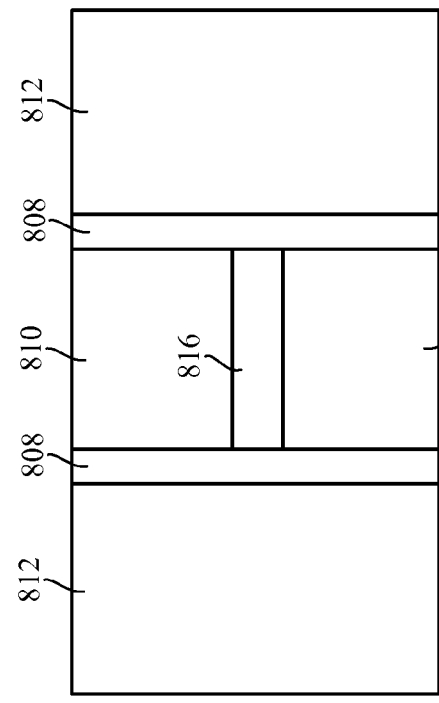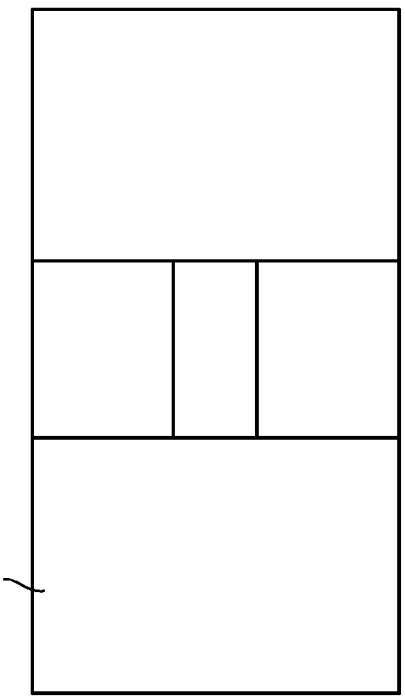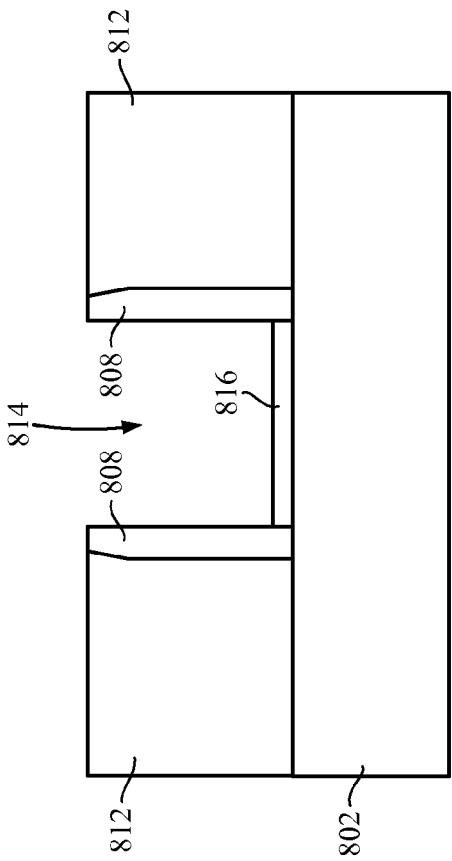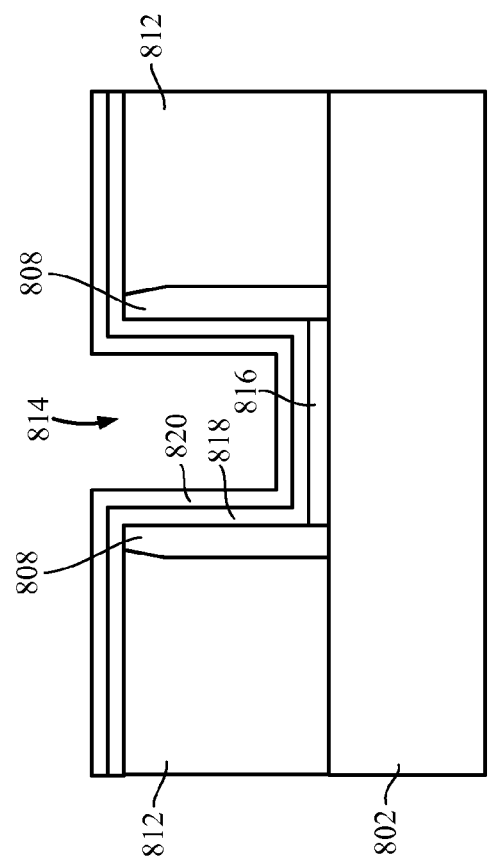
FIG. 10B
FIG. 11B
FIG. 10A
FIG. 11A

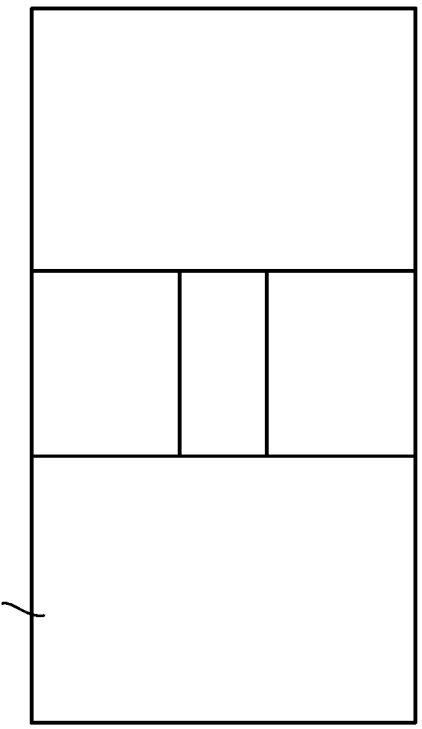
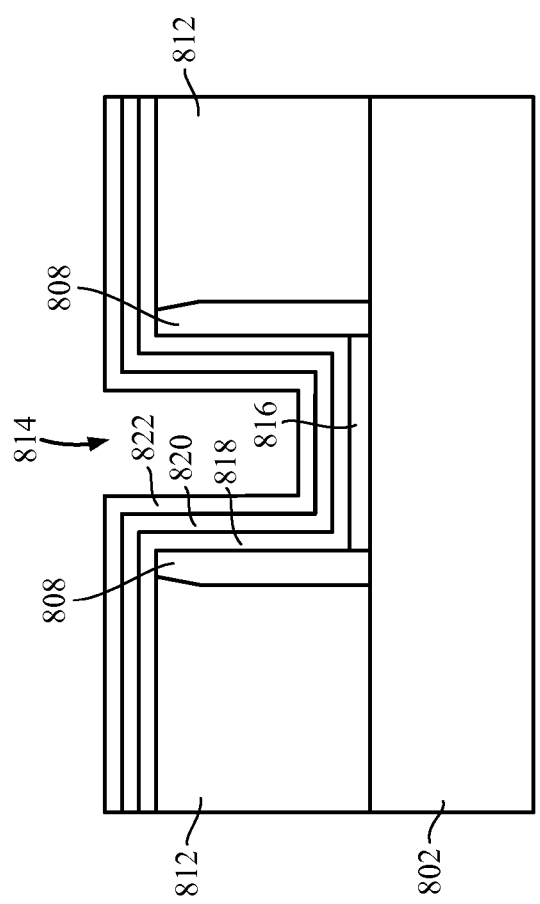
FIG. 12A
FIG. 12B

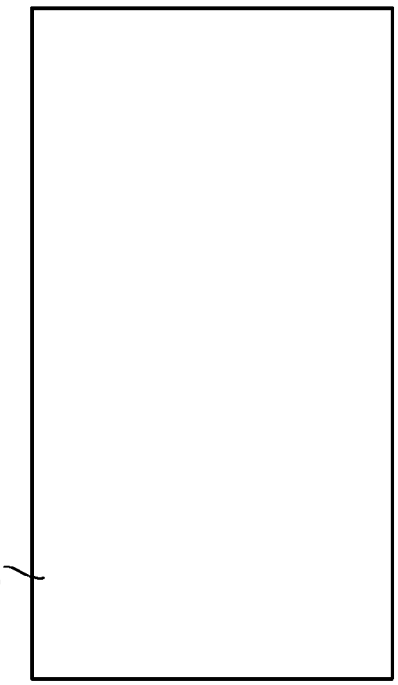
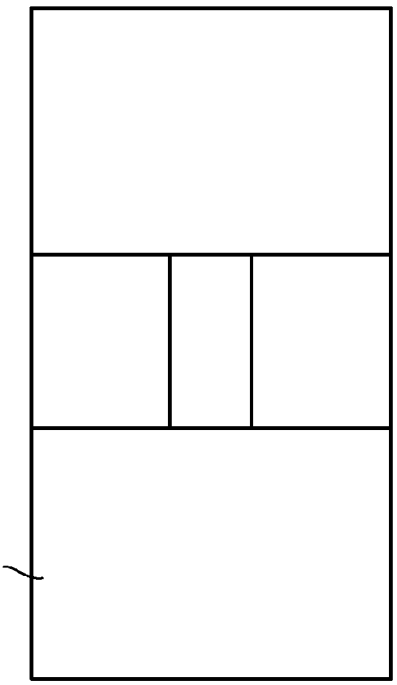
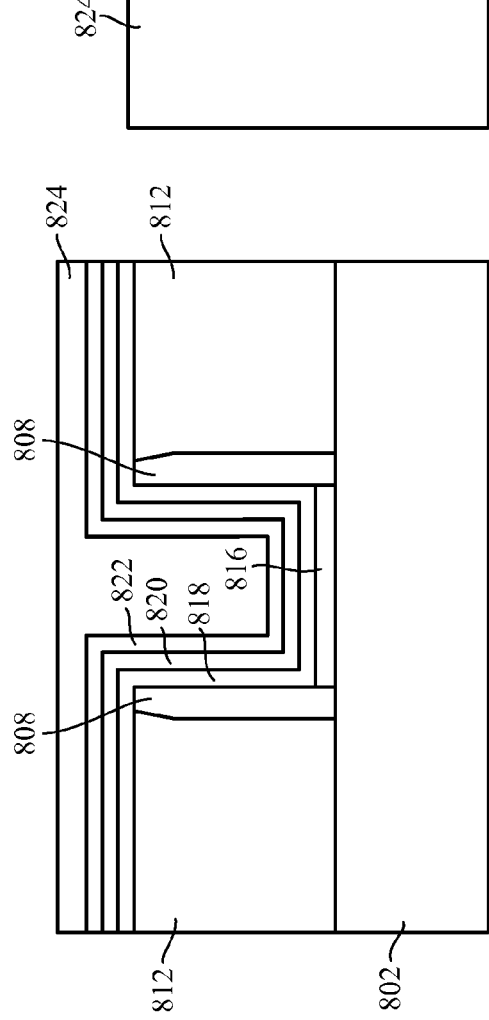
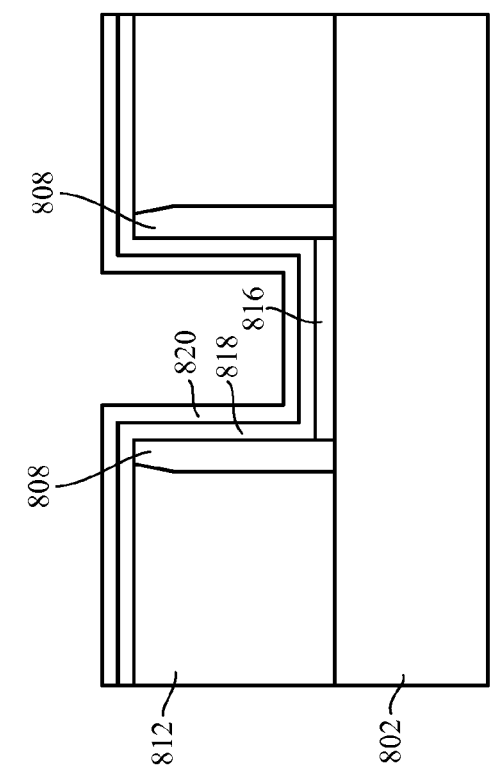
FIG. 13A
FIG. 13B
FIG. 14A
FIG. 14B

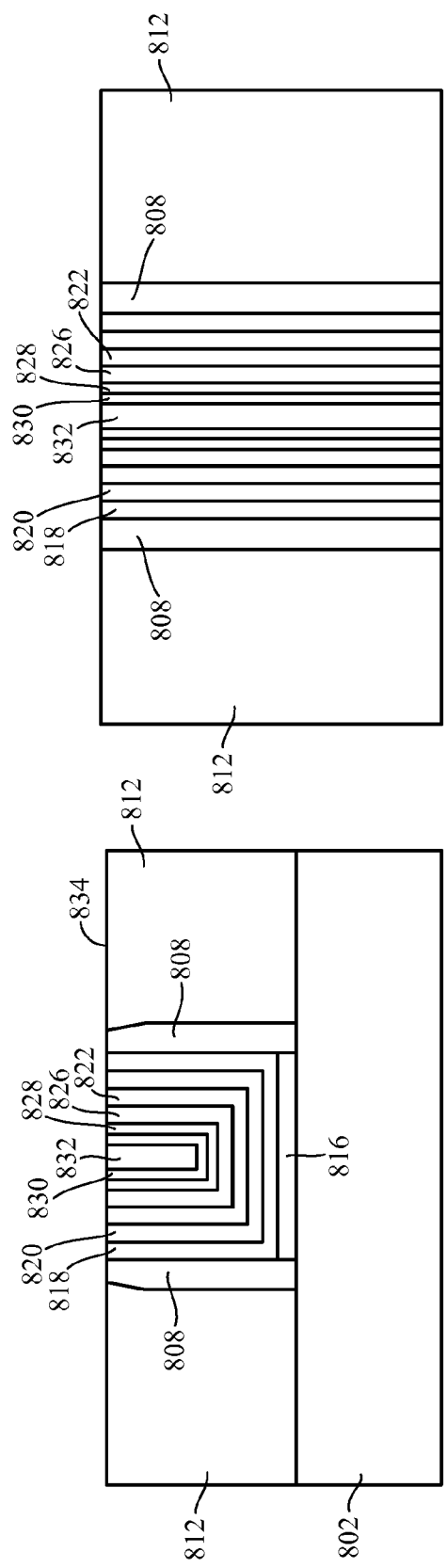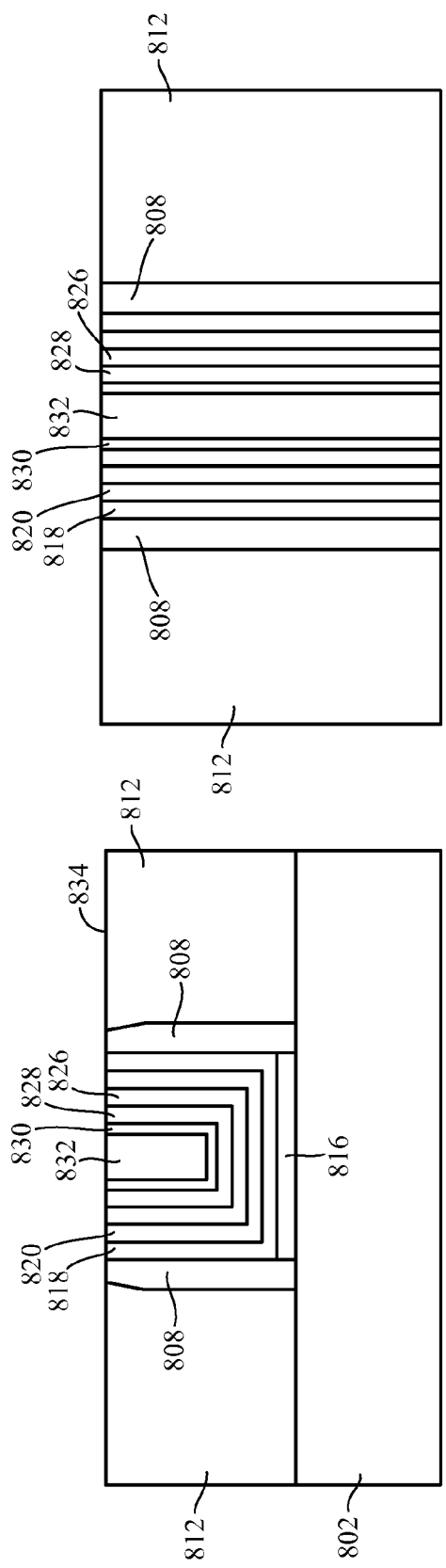

HIGH DIELECTRIC CONSTANT/METAL GATE (HK/MG) COMPATIBLE FLOATING GATE (FG)/FERROELECTRIC DIPOLE NON-VOLATILE MEMORY

FIELD OF DISCLOSURE

Various embodiments described herein relate to semiconductor devices, and more particularly, to non-volatile memory and logic devices.

BACKGROUND

Metal oxide semiconductor (MOS) transistors in integrated circuit devices including non-volatile memory devices and logic devices have been scaled down to smaller and smaller dimensions. In non-volatile memory devices, nanocrystals have been proposed as a replacement for conventional floating gates to scale down the thickness of tunnel oxides. In conventional nanocrystal-based non-volatile memory devices, program and erase operations are typically achieved by Fowler-Nordheim (FN) tunneling. However, the fabrication processes for conventional nanocrystal-based non-volatile memory devices may not be compatible with high dielectric constant/metal gate (HK/MG) processes, which are becoming popular for the fabrication of high-density of memory devices. Moreover, conventional nanocrystal-based non-volatile memory devices may suffer from charge loss due to their degradation mechanism. Furthermore, even with the implementation of nanocrystals to reduce the thickness of tunnel oxides, further scaling down of non-volatile memory devices may be limited due to the limitations on device density imposed by nanocrystal processes.

SUMMARY

Exemplary embodiments of the invention are directed to high dielectric constant/metal gate (HK/MG) compatible floating gate (FG)/ferroelectric dipole non-volatile memory and logic devices and methods of making the same.

In an embodiment, a non-volatile memory is provided, the non-volatile memory comprising: a metal gate; a floating gate; and an oxide layer coupled to the metal gate and the floating gate, wherein the floating gate is operable to be programmed or erased by a Fowler-Nordheim (FN) tunneling operation or the oxide layer is operable to be programmed or erased by an electric potential dipole switching operation.

In another embodiment, a logic device is provided, the logic device comprising: a semiconductor fin; a high dielectric constant (HK) oxide layer on the semiconductor fin; a first nitride cap coupled to the HK oxide layer; a second nitride cap coupled to the first nitride cap; and a metal gate coupled to the second nitride cap.

In another embodiment, a method of making a device is provided, the method comprising: forming a semiconductor fin; forming a high dielectric constant (HK) oxide layer on the semiconductor fin; forming a first nitride cap on the HK oxide layer as a floating gate; forming a second nitride cap on the first nitride cap; and forming a metal gate on the second nitride cap.

In yet another embodiment, a method for making a device is provided, the method comprising the steps for: forming a semiconductor fin; forming a high dielectric constant (HK) oxide layer on the semiconductor fin; forming a first nitride cap on the HK oxide layer as a floating gate; forming a second nitride cap on the first nitride cap; and forming a metal gate on the second nitride cap.

BRIEF DESCRIPTION OF THE DRAWINGS

The accompanying drawings are presented to aid in the description of embodiments of the invention and are provided solely for illustration of the embodiments and not limitation thereof.

FIGS. 8A and 8B are cross-sectional and top-down plan views, respectively, illustrating incoming wafer preparation and spacer formation for a non-volatile memory device or a logic device.

FIGS. 9A and 9B are cross-sectional and top-down plan views, respectively, illustrating interfacial layer (IL) deposition and chemical mechanical planarization (CMP) for a non-volatile memory device or a logic device.

FIGS. 10A and 10B are cross-sectional and top-down plan views, respectively, illustrating the removal of the dummy polysilicon layer and the dummy oxide layer between the spacers and the formation of an interfacial layer in a non-volatile memory device or a logic device.

FIGS. 11A and 11B are cross-sectional and top-down plan views, respectively, illustrating the deposition of a high dielectric constant (HK) oxide layer followed by the deposition of a nitride layer in a non-volatile memory device or a logic device.

FIGS. 12A and 12B are cross-sectional and top-down plan views, respectively, illustrating the deposition of a doped oxide layer in a non-volatile memory device or a logic device.

FIGS. 13A and 13B are cross-sectional and top-down plan views, respectively, illustrating the application of a spin-on dielectric (SOD) or another masking material to a non-volatile memory device.

FIGS. 14A and 14B are cross-sectional and top-down plan views, respectively, illustrating the removal of the doped oxide layer device in the fabrication of a logic device.

FIGS. 19A and 19B are cross-sectional and top-down plan views, respectively, illustrating an embodiment of a non-volatile memory device after a metal gate planarization process is applied to the non-volatile memory device.

FIGS. 20A and 20B are cross-sectional and top-down plan views, respectively, illustrating an embodiment of a logic device after a metal gate planarization process is applied to the logic device.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
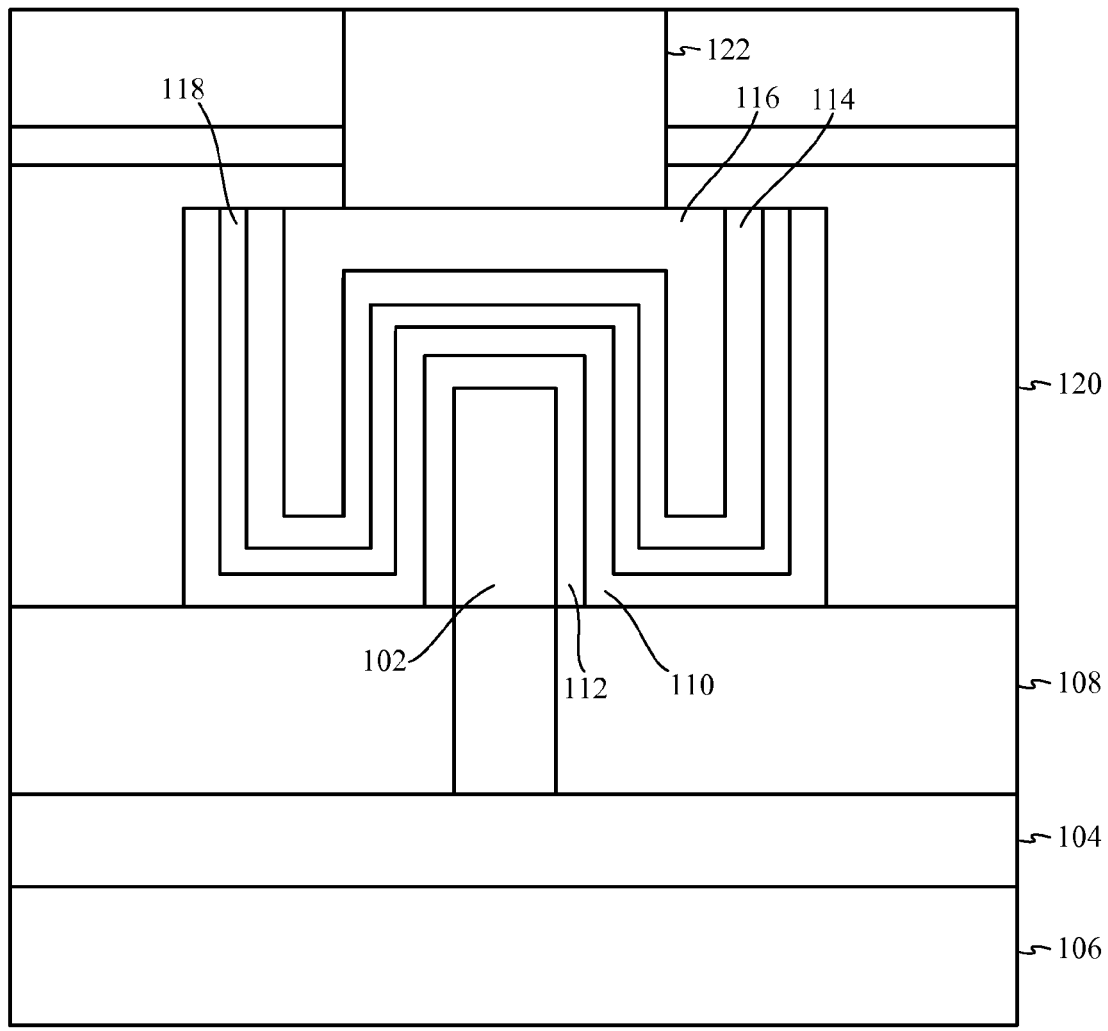
FIG. 1 is a cross-sectional view of an embodiment of an N-type non-volatile memory device.

FIG. 1 is a cross-sectional view of an embodiment of an N-type non-volatile memory device. The cross-sectional view of FIG. 1 is taken across a semiconductor fin 102, such as a silicon fin, which is provided on a P-well 104, which is provided on a P-substrate 106. In an embodiment, a shallow trench isolation (STI) layer 108 is also provided. The semiconductor fin 102, the P-well 104, the P-substrate 106 and the STI layer 108 may be fabricated by using processes for conventional fin-shaped field effect transistors (Fin-FETs). In the embodiment shown in FIG. 1, a tunneling oxide 110 is provided on the semiconductor fin 102. In an embodiment, the tunneling oxide 110 comprises a high dielectric constant (HK) oxide layer. This HK oxide layer may be a metal oxide layer such as a hafnium oxide ($HfO_2$) layer. In a further embodiment, an interfacial layer (IL) 112 is provided between the tunneling oxide 110 and the semiconductor fin 102.

In the embodiment shown in FIG. 1, a block oxide layer or ferroelectric dipole layer 114 is provided on the tunneling oxide 110, and a metal gate 116 is provided on the block oxide layer or ferroelectric dipole layer 114. In an embodiment, the block oxide layer or ferroelectric dipole layer 114 comprises an oxide layer or doped oxide layer such as a doped $HfO_2$ layer. In a further embodiment, the doped $HfO_2$ layer comprises a silicon-doped $HfO_2$ layer. In the case of block oxide layer 114, the device comprises a floating gate storage device. In the case of ferroelectric dipole layer 114, the device comprises a ferroelectric/floating gate storage device. In the embodiment shown in FIG. 1, the metal gate 116 comprises an N-type metal gate, although in other embodiments, the metal gate 116 may comprise a P-type metal gate, which will be described in further detail with respect to FIGS. 2 and 4.

In the embodiment shown in FIG. 1, a nitride cap 118 is provided between the tunneling oxide 110 and the block oxide layer or ferroelectric dipole layer 114. In an embodiment, the nitride cap 118 comprises a titanium nitride (TiN) layer, although other types of nitrides may also be used in alternate embodiments. The nitride cap 118 serves as a floating gate in an embodiment. One or more additional cap layers may be provided between the tunneling oxide 110 and the block oxide layer or ferroelectric dipole layer 114 or between the block oxide layer or ferroelectric dipole layer 114 and the metal gate 116, exemplary embodiments of which will be described in further detail with respect to FIGS. 19A-B. In the embodiment shown in FIG. 1, the non-volatile memory device further comprises an interfacial layer (IL) 120 coupled to the tunneling oxide 110 and a metal layer 122 coupled to the metal gate 116. In an embodiment, the nitride cap floating gate 118 or ferroelectric dipole layer 114 serves as a data storage layer in the non-volatile memory device that is capable of being programmed and erased. Program and erase operations for the N-type non-volatile memory device may be performed by changing the charge in the nitride cap floating gate 118 or switching the dipole in the ferroelectric dipole layer 114. Embodiments of program and erase operations will be described in further detail with respect to FIGS. 5A and 5B, which illustrate Fowler-Nordheim (FN) tunneling for the floating gate storage device and dipole switching operations for the ferroelectric dipole storage device.

Figure 2:
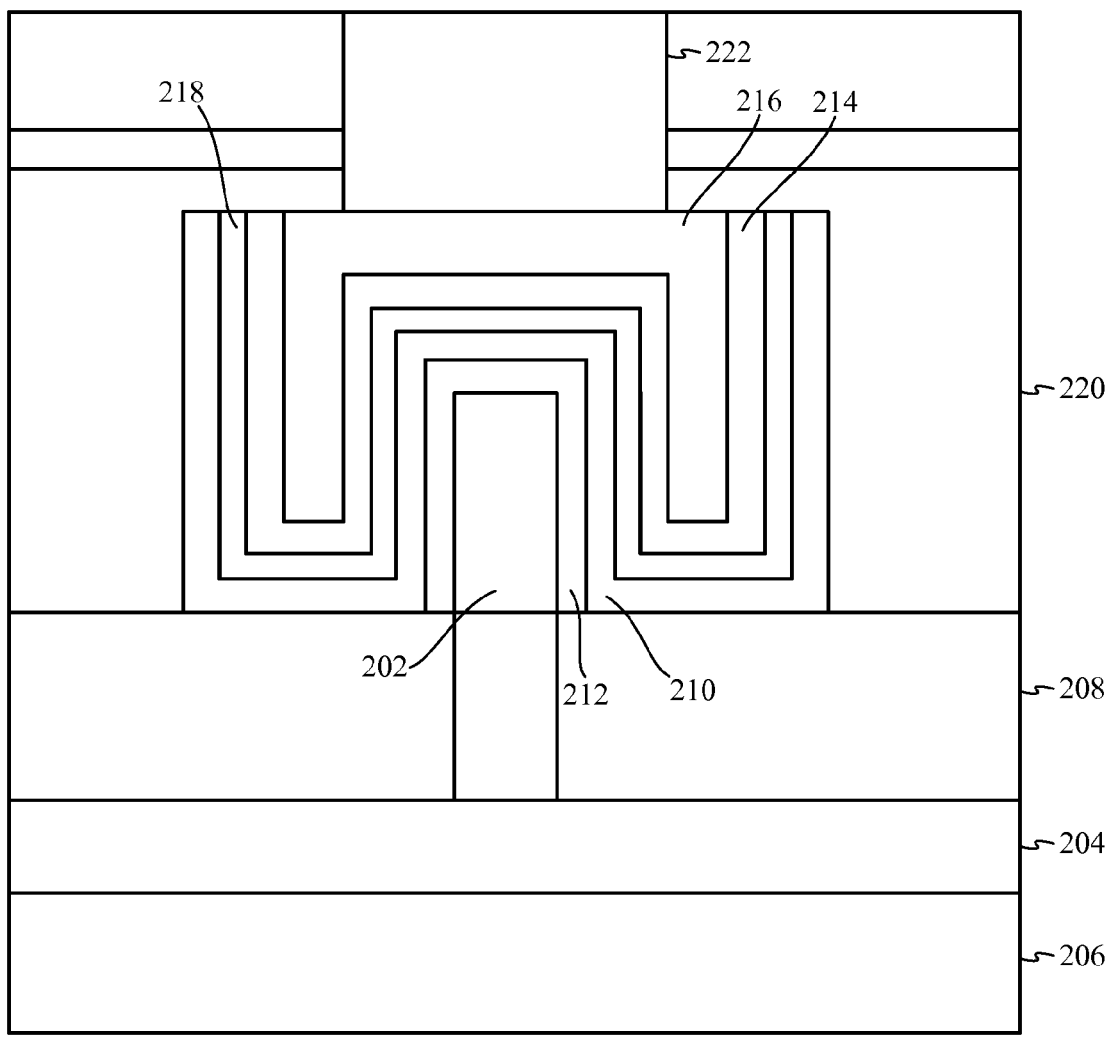
FIG. 2 is a cross-sectional view of an embodiment of a P-type non-volatile memory device.

FIG. 2 is a cross-sectional view of an embodiment of a P-type non-volatile memory device. The P-type non-volatile memory device in the embodiment shown in FIG. 2 is similar to the N-type device in the embodiment shown in FIG. 1, except that the metal gate comprises a P-type metal gate instead of an N-type metal gate and an N-well instead of a P-well is provided on a P-substrate. Referring to FIG. 2, a semiconductor fin 202, such as a silicon fin, is provided on an N-well 204, which is provided on a P-substrate 206. In an embodiment, an STI layer 208 is also provided. The structure of the semiconductor fin 202, the STI layer 208, the N-well 204 and the P-substrate 206 in FIG. 2 is similar to the corresponding structure shown in FIG. 1 except that the P-well 104 in FIG. 1 is replaced by the N-well 204 in FIG. 2. Referring to FIG. 2, a tunneling oxide 210 is provided on the semiconductor fin 202. In an embodiment, the tunneling oxide 210 comprises a high dielectric constant (HK) oxide layer. This HK oxide layer may be a metal oxide layer such as an $HfO_2$ layer. In a further embodiment, an interfacial layer (IL) 212 is provided between the tunneling oxide 210 and the semiconductor fin 202.

In FIG. 2, a block oxide layer or ferroelectric dipole layer 214 is provided on the tunneling oxide 210, and a metal gate 216 is provided on the block oxide layer or ferroelectric dipole layer 214. In an embodiment, the ferroelectric dipole layer 214 comprises a doped oxide layer, for example, a doped $HfO_2$ layer such as a silicon-doped $HfO_2$ layer. In the case of block oxide layer 214, the device comprises a floating gate storage device. In the case of ferroelectric dipole layer 214, the device comprises a ferroelectric/floating gate storage device. The metal gate 216 comprises a P-type metal gate in the embodiment shown in FIG. 2. In a further embodiment, a nitride cap 218 is provided between the tunneling oxide 210 and the block oxide layer or ferroelectric dipole layer 214. The nitride cap 218 may comprise a TiN layer, although other types of nitrides may also be used in alternate embodiments as a floating gate. One or more additional cap layers may be provided between the tunneling oxide 210 and the block oxide layer or ferroelectric dipole layer 214 or between the block oxide layer or ferroelectric dipole layer 214 and the metal gate 216, exemplary embodiments of which will be described in further detail with respect to FIGS. 19A-B.

Similar to the embodiment shown in FIG. 1, the P-type non-volatile memory device in the embodiment shown in FIG. 2 further comprises an interfacial layer (IL) 220 coupled to the tunneling oxide 210 and a metal layer 222 coupled to the metal gate 216. In an embodiment, program and erase operations for the P-type non-volatile memory device may be performed by changing the charge in the nitride cap floating gate 218 or switching the dipole in the ferroelectric dipole layer 214. In an embodiment, the program and erase operations are achieved by FN tunneling for a floating gate storage device and by electric field dipole switching for an electric dipole storage device, which will be described in further detail with respect to FIGS. 5A and 5B.

Figure 3:
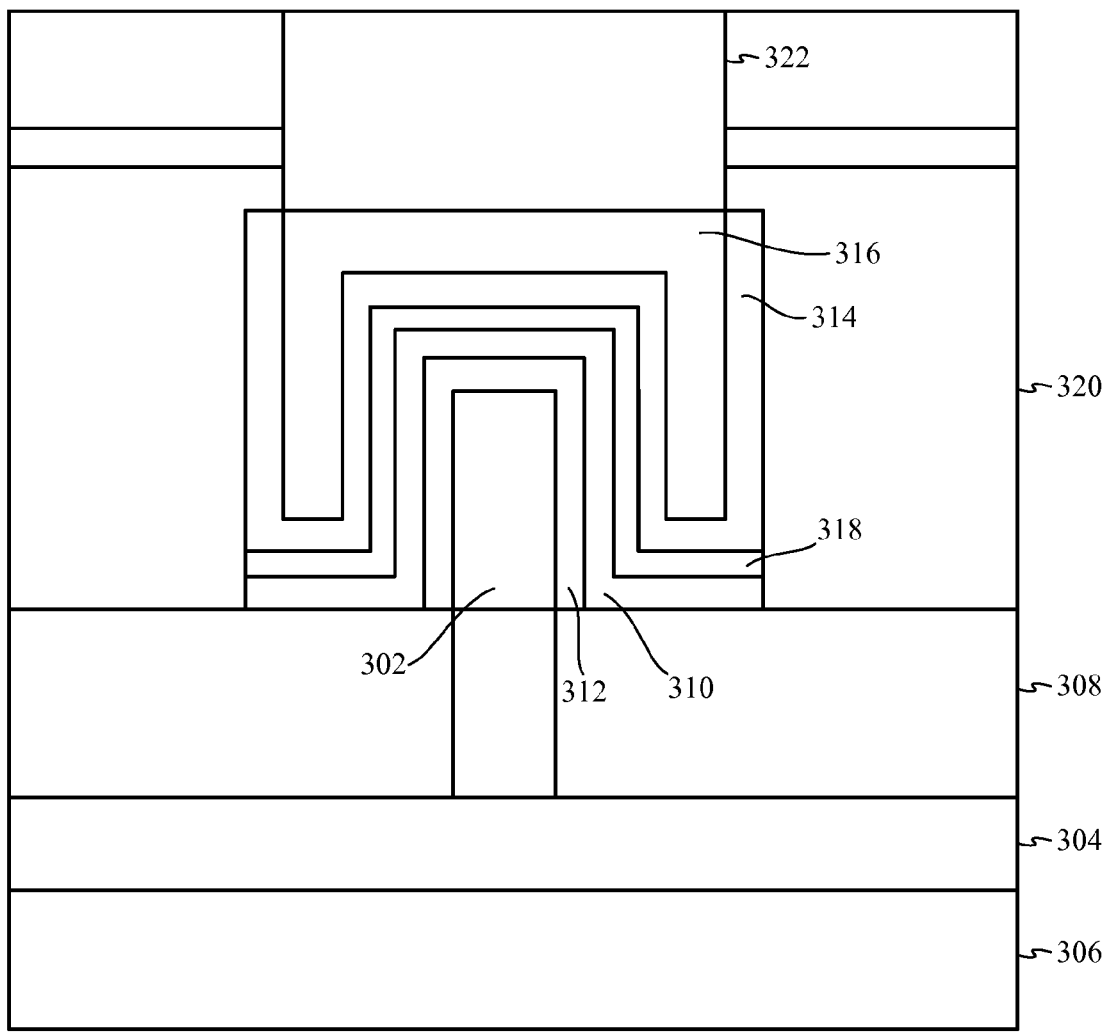
FIG. 3 is a cross-sectional view of another embodiment of an N-type non-volatile memory device.

FIG. 3 is a cross-sectional view of another embodiment of an N-type non-volatile memory device. The N-type non-volatile memory device in the embodiment shown in FIG. 3 is similar to the embodiment shown in FIG. 1, except that the tunneling oxide and the nitride cap do not extend vertically between the IL and the block oxide layer or ferroelectric dipole layer. Referring to FIG. 3, a semiconductor fin 302, such as a silicon fin, a P-well 304, a P-substrate 306 and an STI layer 308 are provided in a similar manner to the embodiment shown in FIG. 1. In the embodiment shown in FIG. 3, a tunneling oxide 310 is provided on the semiconductor fin 302. In an embodiment, the tunneling oxide 310 comprises a high dielectric constant (HK) oxide layer, which may be a metal oxide layer such as a hafnium oxide ($HfO_2$) layer. In a further embodiment, an interfacial layer (IL) 312 may be provided between the tunneling oxide 310 and the semiconductor fin 302.

In the embodiment shown in FIG. 3, a block oxide layer or ferroelectric dipole layer 314 is provided on the tunneling oxide 310, and a metal gate 316 is provided on the block oxide layer or ferroelectric dipole layer 314. In an embodiment, the ferroelectric dipole layer 314 comprises a doped oxide layer, for example, a doped $HfO_2$ layer such as a silicon-doped $HfO_2$ layer. In the case of block oxide layer 314, the device comprises a floating gate storage device. In the case of ferroelectric dipole layer 314, the device comprises a ferroelectric/floating gate storage device. The metal gate 316 comprises an N-type metal gate in the embodiment shown in FIG. 3. In an embodiment, a metal layer 322 is provided on the metal gate 316. In a further embodiment, a nitride cap 318 is provided between the tunneling oxide 310 and the block oxide layer or ferroelectric dipole layer 314. The nitride cap 318 may comprise a titanium nitride (TiN) layer or another type of nitride layer serving as a floating gate. In other embodiments, one or more additional cap layers may be provided between the tunneling oxide 310 and the block oxide layer or ferroelectric dipole layer 314 or between the block oxide layer or ferroelectric dipole layer 314 and the metal gate 316. In FIG. 3, the N-type non-volatile memory device also comprises an interfacial layer (IL) 320.

Unlike the embodiment of the N-type non-volatile memory device in FIG. 1, the IL 320 in the embodiment of the N-type non-volatile memory device as shown in FIG. 3 is in direct contact with vertical surfaces of the block oxide layer or ferroelectric dipole layer 314, because the layers of the tunneling oxide 310 and the nitride cap 318 do not extend vertically between the IL 320 and the block oxide layer or ferroelectric dipole layer 314. In an embodiment, the N-type non-volatile memory device as shown in FIG. 3 is capable of performing program and erase operations using FN tunneling for the floating gate storage device and electric field dipole switching for the ferroelectric dipole storage device in the same manner as the N-type non-volatile memory device in the embodiment shown in FIG. 1.

Figure 4:
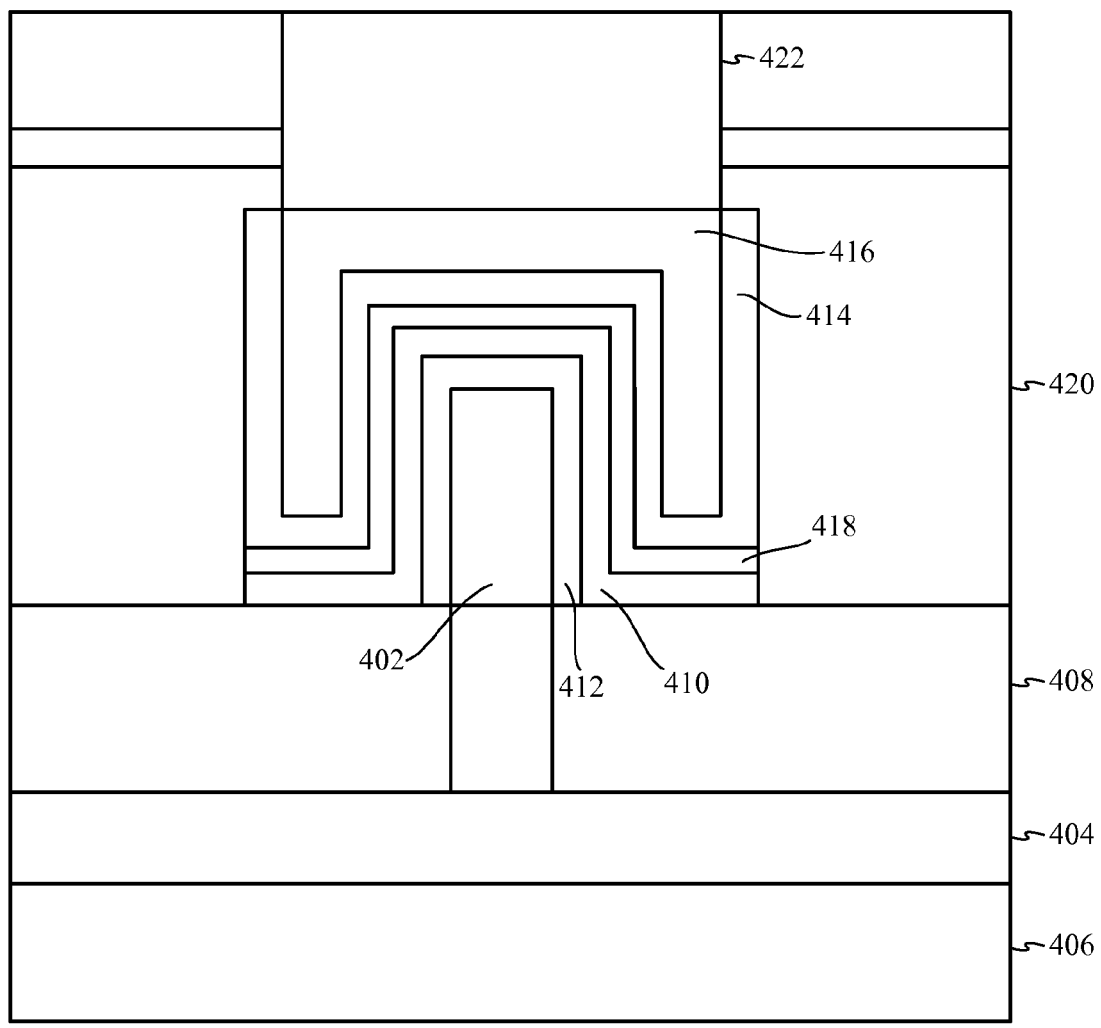
FIG. 4 is a cross-sectional view of another embodiment of a P-type non-volatile memory device.

FIG. 4 is a cross-sectional view of another embodiment of a P-type non-volatile memory device. The P-type non-volatile memory device in the embodiment shown in FIG. 4 is similar to the embodiment shown in FIG. 2, except that the tunneling oxide and the nitride cap do not extend vertically between the IL and the block oxide layer or ferroelectric dipole layer. In FIG. 4, a semiconductor fin 402, such as a silicon fin, an N-well 404, a P-substrate 406 and an STI layer 408 are provided in a similar manner to the embodiment shown in FIG. 2. In the embodiment shown in FIG. 4, a tunneling oxide 410 is provided on the semiconductor fin 402. In an embodiment, the tunneling oxide 410 comprises a high dielectric constant (HK) oxide layer, which may be a metal oxide layer such as a hafnium oxide ($HfO_2$) layer. In a further embodiment, an interfacial layer (IL) 412 may be provided between the tunneling oxide 410 and the semiconductor fin 402.

In the embodiment shown in FIG. 4, a block oxide layer or ferroelectric dipole layer 414 is provided on the tunneling oxide 410, and a metal gate 416 is provided on the block oxide layer or ferroelectric dipole layer 414. In an embodiment, the ferroelectric dipole layer 414 comprises a doped oxide layer, for example, a doped $HfO_2$ layer such as a silicon-doped $HfO_2$ layer. For the block oxide layer 414 case, the device comprises a floating gate storage device. For the ferroelectric dipole layer 414 case, the device comprises a ferroelectric/floating gate storage device. The metal gate 416 comprises a P-type metal gate in the embodiment shown in FIG. 4. In an embodiment, a metal layer 422 is provided on the metal gate 416. In a further embodiment, a nitride cap 418 is provided between the tunneling oxide 410 and the block oxide layer or ferroelectric dipole layer 414. The nitride cap 418 may comprise a titanium nitride (TiN) layer or another type of nitride layer serving as a floating gate. In other embodiments, one or more additional cap layers may be provided between the tunneling oxide 410 and the block oxide layer or ferroelectric dipole layer 414 or between the block oxide layer or ferroelectric dipole layer 414 and the metal gate 416. In FIG. 3, the N-type non-volatile memory device also comprises an interfacial layer (IL) 420.

Unlike the embodiment of the P-type non-volatile memory device in FIG. 2, the IL 420 in the embodiment of the P-type non-volatile memory device as shown in FIG. 4 is in direct contact with vertical surfaces of the ferroelectric dipole layer 414, because the layers of the tunneling oxide 410 and the nitride cap 418 do not extend vertically between the IL 420 and the block oxide layer or ferroelectric dipole layer 414. In an embodiment, the P-type non-volatile memory device as shown in FIG. 4 is capable of performing program and erase operations using FN tunneling for the floating gate storage device and electric potential dipole switching for the ferroelectric dipole storage device in the same manner as the P-type non-volatile memory device in the embodiment shown in FIG. 2.

Figures 5A, 5B:
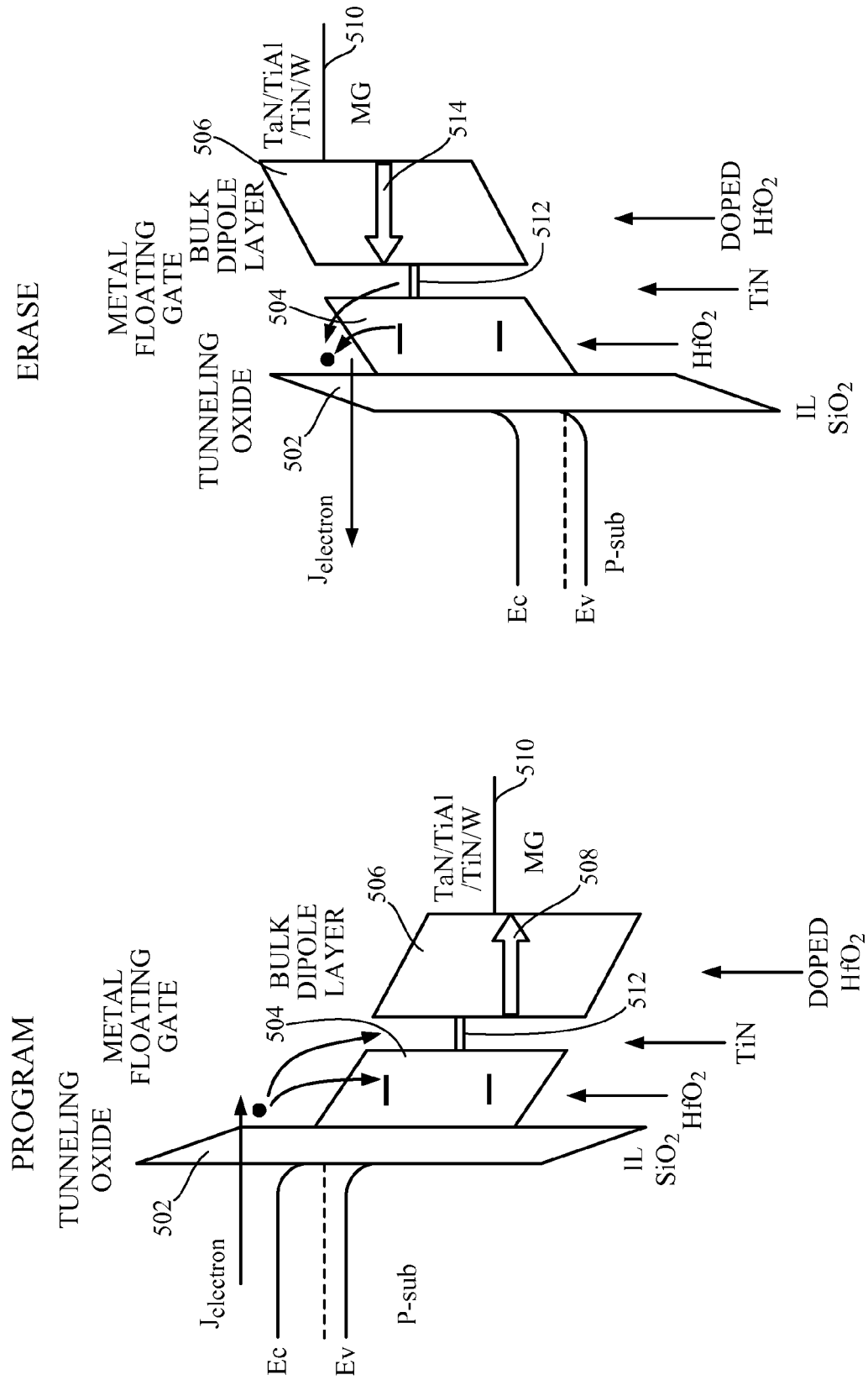
FIGS. 5A and 5B are simplified diagrams illustrating program and erase operations, respectively, of a non-volatile memory device.

FIGS. 5A and 5B are simplified diagrams illustrating exemplary program and erase operations, respectively, of a non-volatile memory device according to an embodiment of the disclosure. In FIG. 5A, which illustrates an exemplary program operation, a current $J_{electron}$ injects electrons through an interfacial layer (IL) 502 to a tunneling oxide 504 or to electrically switch the potential cross the ferroelectric dipole layer. In an embodiment, the interfacial layer (IL) 502 comprises a layer of silicon oxide ($SiO_2$), whereas the tunneling oxide 504 comprises a layer of hafnium oxide ($HfO_2$). For simplicity of illustration, intermediary layers such as barrier layers are omitted in FIGS. 5A and 5B. In FIG. 5A, once the electrons are injected into the tunneling oxide 504, the tunneling oxide 504 experiences Fowler-Nordheim (FN) tunneling, which in turn causes a change to the floating gate charge or electric potential switching on ferroelectric dipole layer 506, also called a bulk dipole layer, to switch its dipole direction, as indicated by arrow 508. In an embodiment, the bulk dipole layer comprises doped $HfO_2$, for example, silicon-doped $HfO_2$.

Once the direction of the dipole in the ferroelectric dipole layer 506 is switched in response to the dipole switching operation caused by the electric switch potential, charge is held or stored in a floating gate, which in an embodiment comprises the ferroelectric dipole layer 506. In an embodiment, a nitride cap 512 which may comprise a titanium nitride (TiN) layer is provided between the tunneling oxide 504 and the block oxide layer or ferroelectric dipole layer 506. In an embodiment, a control gate, such as a metal gate 510, is coupled to the block oxide layer or ferroelectric dipole layer 506 through one or more barrier or cap layers, which may comprise tantalum nitride (TaN), titanium aluminum (TiAl) alloy, or titanium nitride (TiN). Examples of barrier or cap layers between the block oxide layer or ferroelectric dipole layer 506 and the metal gate 510 will be described in further detail with respect to FIGS. 19A-B. In a further embodiment, the metal gate 510 comprises tungsten (W).

FIG. 5B illustrates the non-volatile memory device of FIG. 5A in an erase operation. In FIG. 5B, a current $J_{electron}$ is applied to the IL 502, but in a direction opposite to the direction of the current for a program operation as depicted in FIG. 5A. Referring to FIG. 5B, when the current $J_{electron}$ is applied to the IL 502, electrons are withdrawn from the tunneling oxide 504 or the electric switch potential across the electric dipole layer. Once the electrons are withdrawn from the tunneling oxide 504 or the electric dipole is reverse switched, it experiences a change in the direction of FN tunneling or electric dipole opposite to the direction of FN tunneling or electric dipole in a program operation as depicted in FIG. 5A. Referring to FIG. 5B, FN tunneling in the tunneling oxide 504 for the floating gate storage device and/or electrically switching the potential across the electric dipole layer causes the ferroelectric dipole layer 506 to switch its dipole direction, as indicated by arrow 514 for the ferroelectric dipole storage device, thereby removing the charge stored in the floating gate or reversing the direction of the ferroelectric dipole layer 506. The erase operation is completed once the charge stored in the floating gate is removed or the direction of the electric dipole layer is reversed.

Figure 6:
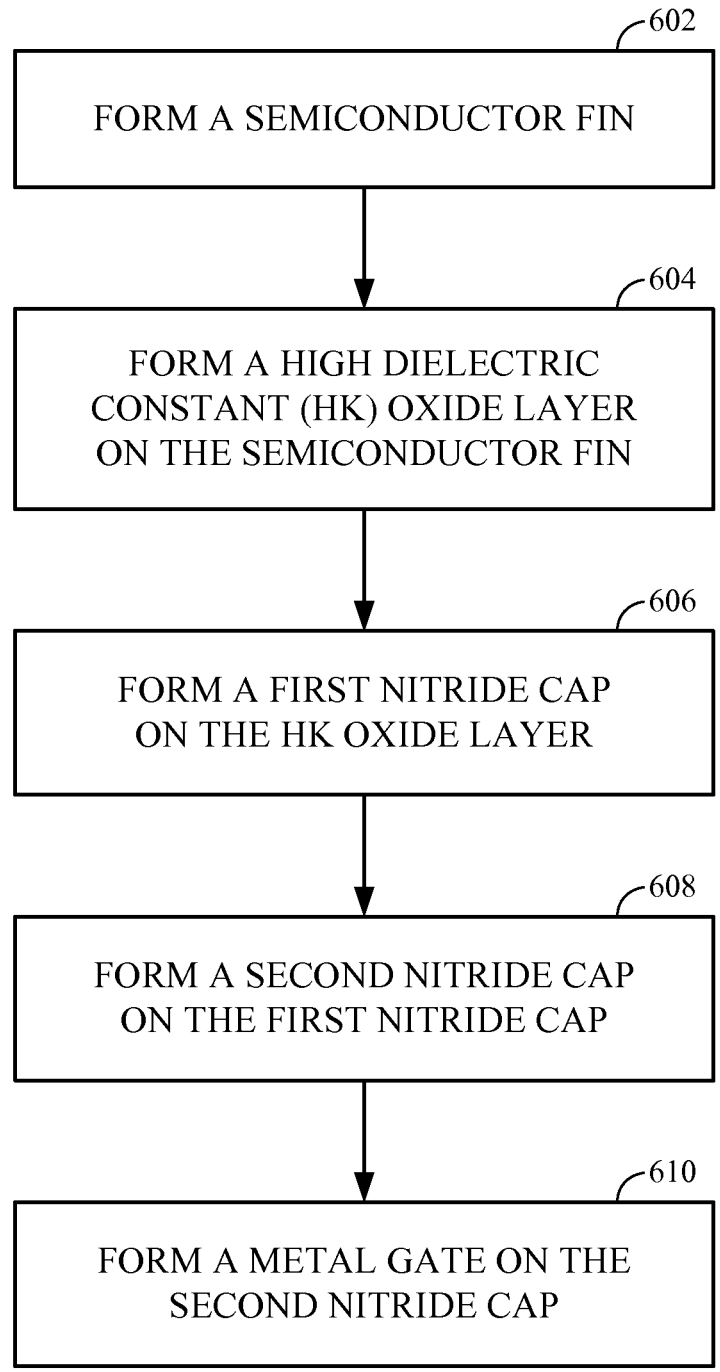
FIG. 6 is a simplified flowchart illustrating an embodiment of a method for making a logic device.
Figure 7:
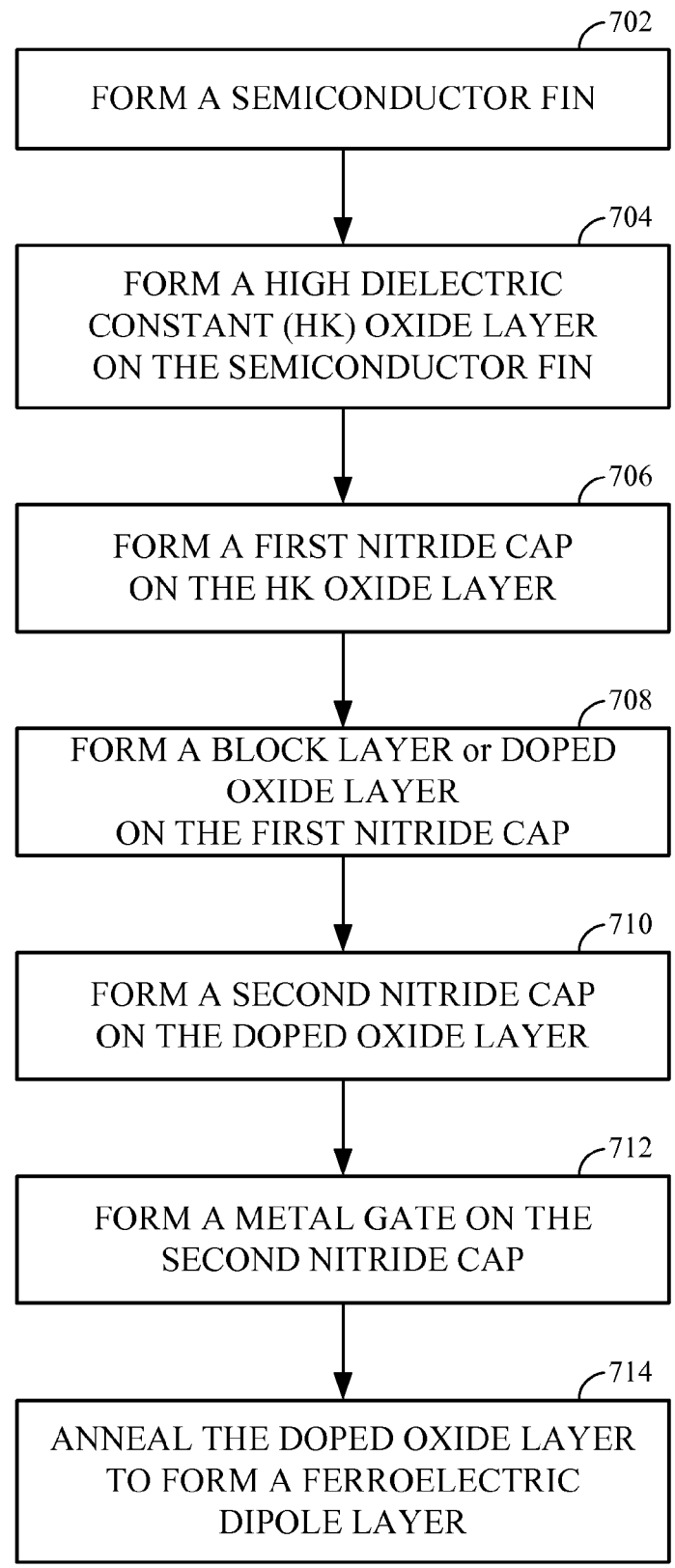
FIG. 7 is a simplified flowchart illustrating an embodiment of a method for making a non-volatile memory device.

FIG. 6 is a simplified flowchart illustrating an embodiment of a method for making a logic device, whereas FIG. 7 is a simplified flowchart illustrating an embodiment of a method for making a non-volatile memory device. In an embodiment, a logic device may be fabricated in a similar manner to a non-volatile memory device, except that the logic device does not include a floating gate, which in an embodiment comprises a ferroelectric dipole layer such as a doped $HfO_2$ layer or a silicon-doped $HfO_2$ layer. Referring to FIG. 6, which illustrate a method for making a logic device, a semiconductor fin is formed in step 602. In an embodiment, the semiconductor fin comprises a silicon fin. A high dielectric constant (HK) oxide layer is then formed on the semiconductor fin in step 604. In an embodiment, the HK oxide layer comprises a hafnium oxide ($HfO_2$) layer. After the HK oxide layer is formed, a first nitride cap is formed on the HK oxide layer in step 606. In an embodiment, the first nitride cap comprises titanium nitride (TiN). A second nitride cap is then formed on the first nitride cap in step 608. In an embodiment, the second nitride cap comprises tantalum nitride (TaN). A metal gate is then formed on the second nitride cap in step 610. Embodiments of process steps for making a high dielectric constant/metal gate (HK/MG) logic device will be described in further detail with respect to FIGS. 8A-20B.

FIG. 7 is a simplified flowchart illustrating an embodiment of a method for making a HK/MG non-volatile memory device having a floating gate or ferroelectric dipole gate which includes a ferroelectric dipole layer. In FIG. 7, a semiconductor fin is formed in step 702. In an embodiment, the semiconductor fin comprises a silicon fin. A high dielectric constant (HK) oxide layer is then formed on the semiconductor fin in step 704. In an embodiment, the HK oxide layer comprises a hafnium oxide ($HfO_2$) layer. After the HK oxide layer is formed, a first nitride cap is formed on the HK oxide layer in step 706. In an embodiment, the first nitride cap comprises titanium nitride (TiN) serving as a floating gate. After the first nitride cap is formed, a block oxide gate layer or doped oxide layer is formed on the first nitride cap in step 708. In an embodiment, the doped oxide layer comprises a doped hafnium oxide ($HfO_2$) layer. In a further embodiment, the doped oxide layer comprises a silicon-doped $HfO_2$ layer.

After the doped oxide layer is formed on the first nitride cap, a second nitride cap is then formed on the doped oxide layer in step 710. In an embodiment, the second nitride cap comprises tantalum nitride (TaN). A metal gate is then formed on the second nitride cap in step 712. The doped oxide layer is then annealed to form a ferroelectric dipole layer in step 714. In an embodiment, the doped oxide layer, which comprises a doped $HfO_2$ layer, is subjected to a fast laser annealing process, which converts the doped $HfO_2$ layer to a bulk ferroelectric dipole layer. In a further embodiment, the fast laser annealing process is a millisecond (ms) annealing process, which is a flash annealing process completed in 1 millisecond or less. Embodiments of process steps for making a HK/MG non-volatile memory device with a ferroelectric dipole will described in further detail with respect to FIGS. 8A-20B.

FIGS. 8A-20B are cross-sectional and top-down plan views illustrating embodiments of processes for making a HK/MG logic device and a HK/MG non-volatile memory device with a ferroelectric dipole. FIG. 8A is a cross-sectional view, taken along a semiconductor fin 802, illustrating incoming wafer preparation and spacer formation. In FIG. 8A, a dummy oxide layer 804 is formed on the semiconductor fin 802, a dummy polysilicon layer 806 is formed on the dummy oxide layer 804, and spacers 808 are formed on the semiconductor fin 802 on the sides of the dummy polysilicon layer 806 and the dummy oxide layer 804. For the purpose of illustration, the cross-sectional view of FIG. 8A is taken along the semiconductor fin, whereas the cross-sectional views of FIGS. 1-4 described above are taken across the semiconductor fin. In other words, the cross-sectional view of FIG. 8A is on a plane that is perpendicular to the plane of the cross-sectional views of FIGS. 1-4. FIG. 8B is a top-down plan view illustrating the positions of the semiconductor fin 802, the dummy polysilicon layer 806, the spacers 808, and a shallow trench isolation (STI) layer 810 exposed in areas not occupied by the semiconductor fin 802, the dummy polysilicon layer 806 and the spacers 808.

FIG. 9A is a cross-sectional view, taken along the semiconductor fin 802, illustrating interfacial layer (IL) deposition and chemical mechanical planarization (CMP). In FIG. 9A, the semiconductor fin 802, the dummy oxide layer 804, the dummy polysilicon layer 806 and the spacers 808 are the same as in FIG. 8A. In FIG. 9A, an interfacial layer (IL) 812 is deposited over the semiconductor fin 802. In FIG. 9B, which is a top-down plan view corresponding to the cross-sectional view of FIG. 9A, the IL 812 is deposited over the STI layer as well as the semiconductor fin (not shown in the top-down plan view of FIG. 9B because the STI layer and the semiconductor fin are covered by the IL 812). After a polishing or planarization process, for example, a CMP process, is applied to the top of the IL 812 after IL deposition, the top surfaces of the dummy polysilicon layer 806 and the spacers 808 are exposed.

FIG. 10A is a cross-sectional view, taken along the semiconductor fin 802, illustrating the removal of the dummy polysilicon layer and the dummy oxide layer between the spacers and the formation of an interfacial layer. In FIG. 10A, a hollow space 814 between the spacers 808 is formed after the removal of the dummy polysilicon layer and the dummy oxide layer, and an interfacial layer 816 is formed on top of the semiconductor fin 802 within the hollow space 814 between the spacers 808. In the top-down plan view of FIG. 10B, which corresponds to the cross-sectional view of FIG. 10A, the interfacial layer 816 is formed only over the exposed portion of the semiconductor fin between the spacers 808, whereas areas of the STI layer 810 between the spacers 808 remain exposed after the removal of the dummy polysilicon layer and the dummy oxide layer. In an embodiment, the interfacial layer 816 comprises an oxide. In a further embodiment, the interfacial layer 816 comprises silicon oxide ($SiO_2$).

FIG. 11A is a cross-sectional view, taken along the semiconductor fin 802, illustrating the deposition of a high dielectric constant (HK) oxide layer followed by the deposition of a nitride layer. In FIG. 11A, a layer of a high dielectric constant (HK) material 818 is deposited over the interfacial layer 816 as well as over the spacers 808 and the IL 812. In an embodiment, the HK material comprises an HK oxide material such as $HfO_2$. In a further embodiment, the layer of HK material 818 is deposited on the interfacial layer 816, the spacers 808 and the IL 812 by using an atomic layer deposition (ALD) process. After the HK material 818 is deposited, a first nitride cap 820 is deposited on the layer of HK material 818. In an embodiment, the first nitride cap 820 comprises titanium nitride (TiN), although other types of nitrides may also be deposited in alternate embodiments.

FIG. 11B is a top-down plan view corresponding to the cross-sectional view of FIG. 11A, showing the deposition of the first nitride cap 820 over the hollow space between the spacers as well as over the IL outside the spacers.

FIG. 12A is a cross-sectional view, taken along the semiconductor fin 802, illustrating the deposition of a doped oxide layer in an embodiment of a process step for fabricating an HK/MG device. Referring to FIG. 12A, a doped oxide layer 822 is deposited on the first nitride cap 820. In an embodiment, the doped oxide layer 822 comprises doped $HfO_2$. In a further embodiment, the doped oxide layer 822 comprises silicon-doped $HfO_2$. In an embodiment, the doped oxide layer 822 is deposited on the first nitride cap 820 by using an atomic layer deposition (ALD) process. FIG. 12B is a top-down plan view corresponding to the cross-sectional view of FIG. 12A, showing the deposition of the doped oxide layer 822 over the first nitride cap.

FIG. 13A is a cross-sectional view, taken along the semiconductor fin 802, illustrating the application of a spin-on dielectric (SOD) or another masking material in an embodiment of a process step for fabricating an HK/MG non-volatile memory device, following the process step as illustrated in FIGS. 12A-B. Whereas the previous process steps illustrated in FIGS. 8A-12B may be applicable to embodiments of process steps in the fabrication of both HK/MG logic devices and HK/MG non-volatile memory devices, application of the SOD or another masking material as illustrated in FIG. 13A is applicable to embodiments of fabricating HK/MG non-volatile memory devices, as SOD or other masking materials may not be necessary in the fabrication of logic devices other than non-volatile memory. In FIG. 13A, a spin-on dielectric (SOD) 824 or another masking material is applied over the doped oxide layer 822, to cover both the hollow region between the spacers 808 and the top of the doped oxide layer 822 over the IL 812. FIG. 13B is a top-down plan view corresponding to the cross-sectional view of FIG. 13A, showing the SOD 824 covering all portions of the device.

FIG. 14A is a cross-sectional view, taken along the semiconductor fin 802, illustrating the removal of the doped oxide layer in an embodiment of a process step for fabricating an HK/MG logic device, following the process step as illustrated in FIGS. 12A-B. In FIG. 14A, the doped oxide layer is absent, and the first nitride cap 820 is again exposed after the removal of the doped oxide layer. In an embodiment, the doped oxide layer, which may be a silicon-doped $HfO_2$ layer or another type of oxide layer, is removed by an etching process. In a further embodiment, the doped oxide layer is removed by a buffered oxide etching (BOE) process. FIG. 14B is a top-down plan view corresponding to the cross-sectional view of FIG. 14A, showing the first nitride cap 820 exposed after the removal of the doped oxide layer.

Figure 15A:
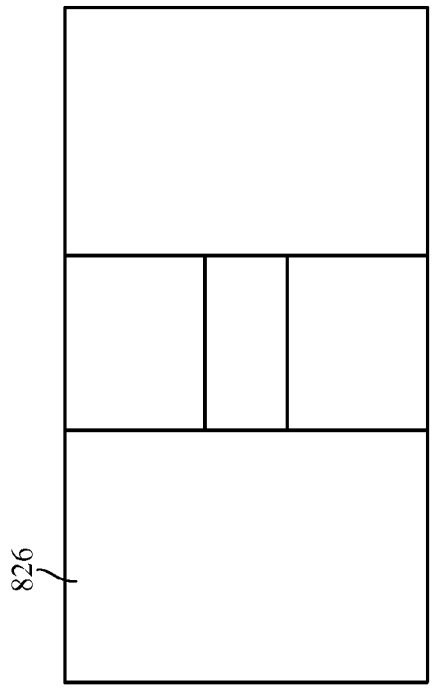
FIGS. 15A and 15B are cross-sectional and top-down plan views, respectively, illustrating the removal of the SOD and the formation of a second nitride cap in the fabrication of a non-volatile memory device.
Figure 15B:
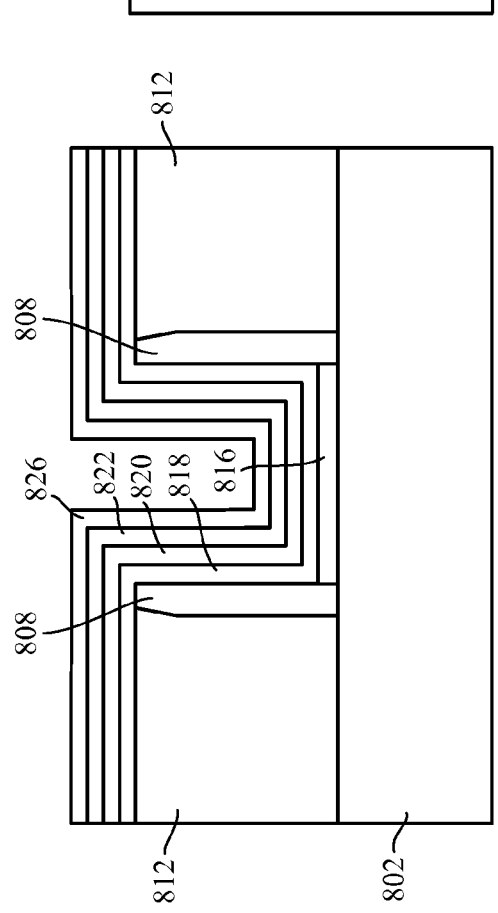

FIG. 15A is a cross-sectional view, taken along the semiconductor fin 802, illustrating the removal of the SOD and the formation of a second nitride cap in an embodiment of a process step for fabricating an HK/MG non-volatile memory device, following the process step as illustrated in FIGS. 13A-B. In FIG. 15A, the SOD 824 as shown in FIG. 13A is removed, and a second nitride cap 826 is formed on the doped oxide layer 822. In an embodiment, the second nitride cap 826 comprises tantalum nitride (TaN), although another type of nitride may also be used. In an embodiment, the second nitride cap 826 is deposited on the surface of the doped oxide layer 822 by using a barrier deposition process. In a further embodiment, the second nitride cap 826 may be formed by an atomic layer deposition (ALD) process. FIG. 15B is a top-down plan view corresponding to the cross-sectional view of FIG. 15A, showing the deposition of the second nitride cap 826 over the doped oxide layer.

Figure 16A:
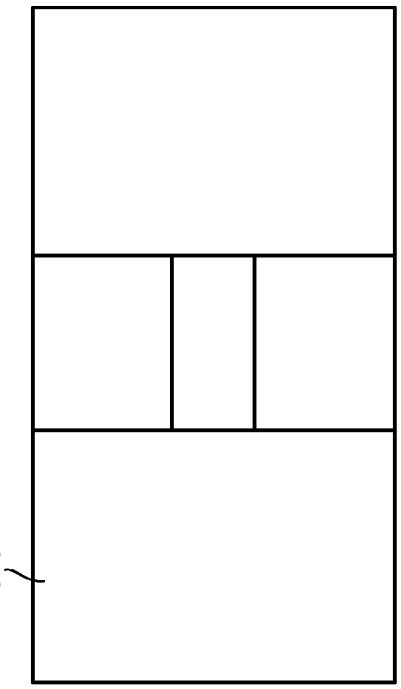
FIGS. 16A and 16B are cross-sectional and top-down plan views, respectively, illustrating the formation of a second nitride cap in a logic device.
Figure 16B:
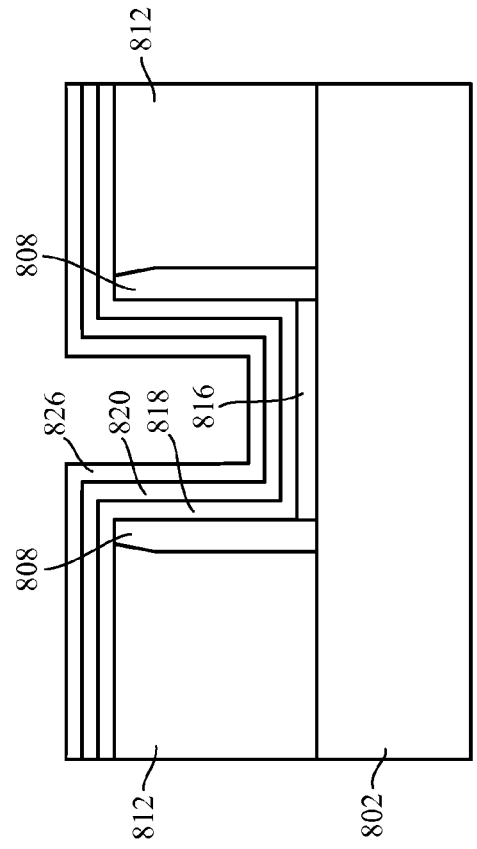

FIG. 16A is a cross-sectional view, taken along the semiconductor fin 802, illustrating the formation of a second nitride cap in an embodiment of a process step for fabricating an HK/MG logic device, following the process step as illustrated in FIGS. 14A-B. Because there is no SOD or another masking material applied in the fabrication of an HK/MG logic device other than non-volatile memory, there is no need for the removal of SOD or another masking material in this embodiment. In FIG. 16A, a second nitride cap 826 is formed directly on the first nitride cap 820, because there is no doped oxide layer for forming a ferroelectric dipole layer in a logic device other than non-volatile memory. In an embodiment, the second nitride cap 826 comprises tantalum nitride (TaN), although another type of nitride may also be used. In an embodiment, the second nitride cap 826 is deposited on the surface of the first nitride cap 820 by using a barrier deposition process. In a further embodiment, the second nitride cap 826 may be formed by an atomic layer deposition (ALD) process. FIG. 16B is a top-down plan view corresponding to the cross-sectional view of FIG. 16A, showing the deposition of the second nitride cap 826 over the first nitride cap. Compared to the non-volatile memory device of FIG. 15A, the logic device of FIG. 16A is similar to the non-volatile memory device of FIG. 15A after the deposition of the second nitride cap, except that the logic device of FIG. 16A lacks the doped oxide layer of FIG. 15A.

Figure 17A:
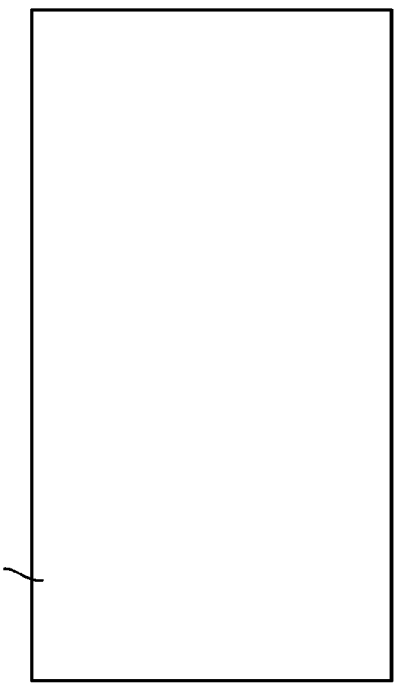
FIGS. 17A and 17B are cross-sectional and top-down plan views, respectively, illustrating additional layers for metal gate formation on top of the second nitride cap in a non-volatile memory device.

FIG. 17A is a cross-sectional view, taken along the semiconductor fin 802, illustrating additional layers for metal gate formation on top of the second nitride cap in an embodiment of process steps for fabricating an HK/MG non-volatile memory device, following the process step as illustrated in FIGS. 15A-B. In FIG. 17A, a metallic layer 828 is formed on the second nitride cap 826. In an embodiment, the metallic layer 828 may comprise an alloy such as titanium-aluminum (TiAl) alloy. In a further embodiment, the metallic layer 828 may be implemented as an NMOS gate work-function metal. In an embodiment, an additional nitride barrier layer 830 is deposited on the metallic layer 828. In a further embodiment, the nitride barrier layer 830 comprises titanium nitride (TiN). In an embodiment, a metal fill 832 such as tungsten (W) is formed on top of the nitride barrier layer 830. Before the top of the non-volatile memory device is planarized, the metal fill 832 covers the entire area of the device, as shown in the top-down plan view of FIG. 17B.

Figure 18A:
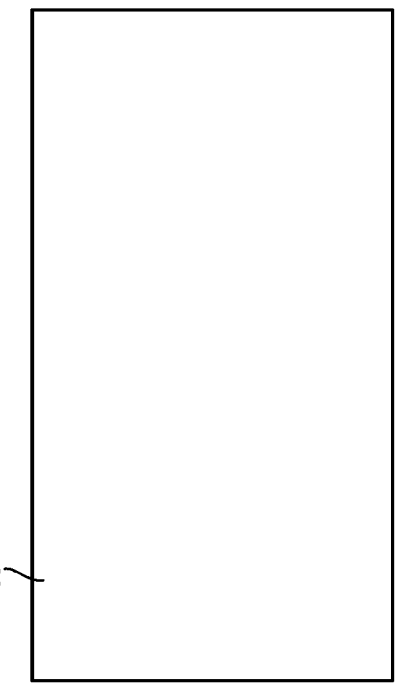
FIGS. 18A and 18B are cross-sectional and top-down plan views, respectively, illustrating additional layers for metal gate formation on top of the second nitride cap in a logic device.
Figure 17B:
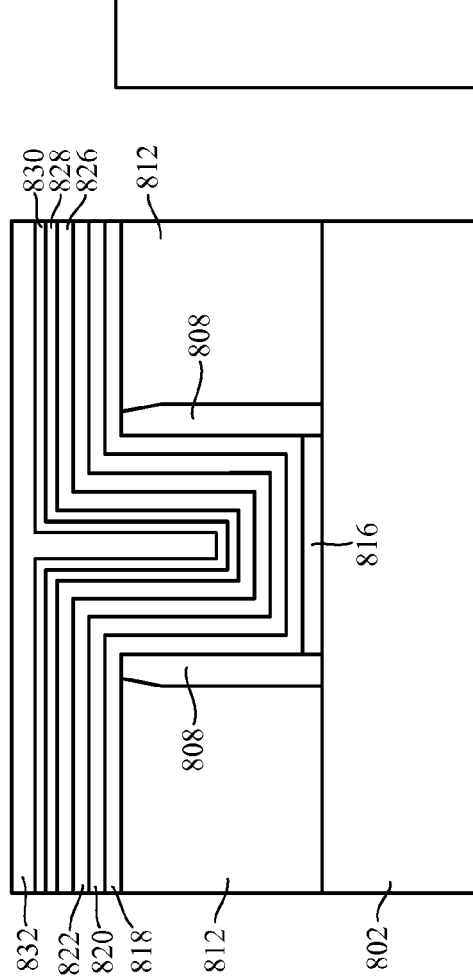
Figure 18B:
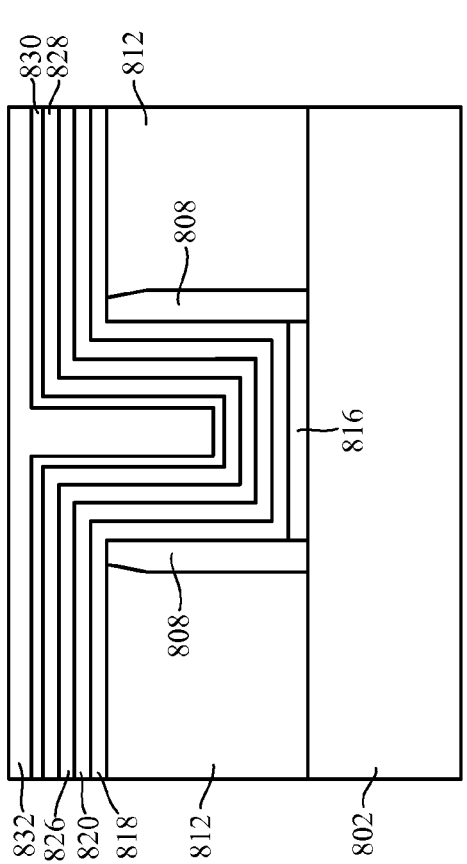

FIG. 18A is a cross-sectional view, taken along the semiconductor fin 802, illustrating additional layers for metal gate formation on top of the second nitride cap in an embodiment of process steps for fabricating an HK/MG logic device, following the process step as illustrated in FIGS. 16A-B. In an embodiment, the additional layers for metal gate formation for the HK/MG logic device of FIG. 18A may be fabricated in a manner similar to the metal gate formation for the HK/MG non-volatile memory device of FIG. 17A. In FIG. 17A, a metallic layer 828 is formed on the second nitride cap 826, and an additional nitride barrier layer 830 is form on the metallic layer 828. In an embodiment, the metallic layer 828 may comprise an alloy such as titanium-aluminum (TiAl) alloy for implementation as an NMOS gate work-function metal. In an embodiment, the nitride barrier layer 830 comprises titanium nitride (TiN). In an embodiment, a metal fill 832 such as tungsten (W) is formed on top of the nitride barrier layer 830. Before the top of the HK/MG logic device is planarized, the metal fill 832 covers the entire area of the device, as shown in the top-down plan view of FIG. 18B.

FIG. 19A is a cross-sectional view, taken along the semiconductor fin 802, illustrating an embodiment of an HK/MG non-volatile memory device after a metal gate planarization process is applied to the non-volatile memory device. In an embodiment, a chemical mechanical planarization (CMP) process is applied to the top of the device to form a metal gate, such that the IL 812, the spacers 808, the HK material 818, the first nitride cap 820, the doped oxide layer 822, the second nitride cap 826, the metallic layer 828, the nitride barrier layer 830 and the metal fill 832 are exposed on the top surface 834 of the device. FIG. 19B is a top-down plan view corresponding to the cross-sectional view of FIG. 19A, showing the stripes of layers 818, 820, 822, 826, 828, 830 and 832 exposed on the top surface between the spacers 808, which spaces these layers from the IL 812. In an embodiment, an annealing process is applied to the non-volatile memory device to convert the doped oxide layer 822, such as a silicon-doped $HfO_2$ layer, to a bulk ferroelectric dipole layer. In a further embodiment, a fast laser annealing process such as a laser millisecond (ms) annealing process may be applied to convert the doped oxide layer 822 to a bulk ferroelectric dipole layer for program/erase operations in the non-volatile memory. In an embodiment, fast laser annealing FIG. 20A is a cross-sectional view, taken along the semiconductor fin 802, illustrating an embodiment of an HK/MG logic device after a metal gate planarization process is applied to the device. The HK/MG logic device of FIG. 20A is similar to the HK/MG non-volatile memory device of FIG. 19A except that the logic device of FIG. 20A lacks a doped oxide layer serving as a bulk ferroelectric dipole layer in the non-volatile memory device of FIG. 19A. Referring to FIG. 20A, a chemical mechanical planarization (CMP) process may be applied to the top of the logic device to form a metal gate, such that the IL 812, the spacers 808, the HK material 818, the first nitride cap 820, the second nitride cap 826, the metallic layer 828, the nitride barrier layer 830 and the metal fill 832 are exposed on the top surface 834 of the device. FIG. 20B is a top-down plan view corresponding to the cross-sectional view of FIG. 20A, showing the stripes of layers 818, 820, 826, 828, 830 and 832 exposed on the top surface between the spacers 808, which spaces these layers from the IL 812.

Embodiments of the process steps described above are compatible with existing HK/MG processes for fabricating non-volatile memory devices and logic devices other than non-volatile memory. In a non-volatile memory device, a doped oxide layer such as a doped $HfO_2$ layer may be implemented and serve as a ferroelectric dipole layer for data storage. Because a ferroelectric dipole cannot be switched by leakage current, non-volatile memory cells may be formed by using HK/MG compatible processes to allow for increased cell density and thereby large-scale integration, without significantly increasing the cost or complexity of fabrication.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A non-volatile memory, comprising:
   a metal gate;
   a floating gate;
   an oxide layer coupled to the metal gate and the floating gate;
   a tunneling oxide coupled to the floating gate; and
   an interfacial layer coupled to the tunneling oxide,
   wherein the floating gate is operable to be programmed or erased by a Fowler-Nordheim (FN) tunneling operation or the oxide layer is operable to be programmed or erased by an electric potential dipole switching operation, and
   wherein the oxide layer comprises a hafnium oxide ($HfO_2$) layer.

2. The non-volatile memory of claim 1, wherein the interfacial layer comprises silicon dioxide ($SiO_2$).

3. The non-volatile memory of claim 1, wherein the $HfO_2$ layer of the oxide layer is a doped hafnium oxide ($HfO_2$) layer.

4. The non-volatile memory of claim 3, wherein the doped $HfO_2$ layer comprises a silicon-doped $HfO_2$ layer.

5. The non-volatile memory of claim 1, wherein the floating gate comprises titanium nitride (TiN).

6. The non-volatile memory of claim 1, wherein the metal gate comprises an N-type metal gate.

7. The non-volatile memory of claim 1, wherein the metal gate comprises a P-type metal gate.

8. The non-volatile memory of claim 1,
   wherein the oxide layer is in between the metal gate and the floating gate, and
   wherein the tunneling oxide is in between the floating gate and the interfacial layer.

9. The non-volatile memory of claim 1, wherein the oxide layer and the tunneling oxide do not contact each other.

10. The non-volatile memory of claim 1, further comprising a silicon fin, wherein the interfacial layer is in between the silicon fin and the tunneling oxide.

11. The non-volatile memory of claim 1,
    wherein the floating gate comprises a first nitride cap,
    wherein the non-volatile memory further comprises a second nitride cap between the metal gate and the oxide layer, and
    wherein the oxide layer is in between the second nitride cap and the first nitride cap.

12. A non-volatile memory, comprising:
    a metal gate;
    a floating gate; and
    an oxide layer coupled to the metal gate and the floating gate,
    wherein the oxide layer is operable to be programmed or erased by an electric potential dipole switching operation.

13. The non-volatile memory of claim 12, wherein the oxide layer comprises a hafnium oxide ($HfO_2$) layer.

14. The non-volatile memory of claim 12, wherein the oxide layer comprises a ferroelectric dipole layer comprising a doped hafnium oxide ($HfO_2$) layer.

15. The non-volatile memory of claim 14, wherein the doped $HfO_2$ layer comprises a silicon-doped $HfO_2$ layer.

16. The non-volatile memory of claim 12, wherein the metal gate comprises an N-type metal gate.

17. The non-volatile memory of claim 12, wherein the metal gate comprises a P-type metal gate.

18. A non-volatile memory, comprising:
    a metal gate;
    a block oxide layer coupled to the metal gate;
    a floating gate coupled to the block oxide layer;
    a tunneling oxide coupled to the floating gate; and
    an interfacial layer coupled to the tunneling oxide,
    wherein the floating gate is operable to be programmed or erased by a Fowler-Nordheim (FN) tunneling operation.

19. The non-volatile memory of claim 18, wherein the tunneling oxide comprises hafnium oxide ($HfO_2$).

20. The non-volatile memory of claim 18,
    wherein the block oxide layer is in between the metal gate and the floating gate, and
    wherein the tunneling oxide is in between the floating gate and the interfacial layer.

21. The non-volatile memory of claim 18, wherein the block oxide layer and the tunneling oxide do not contact each other.

22. The non-volatile memory of claim 18, further comprising a silicon fin, wherein the interfacial layer is in between the silicon fin and the tunneling oxide.

23. The non-volatile memory of claim 18, wherein the floating gate comprises titanium nitride (TiN).

24. The non-volatile memory of claim 18,
    wherein the floating gate comprises a first nitride cap,
    wherein the non-volatile memory further comprises a second nitride cap between the metal gate and the block oxide layer, and
    wherein the block oxide layer is in between the second nitride cap and the first nitride cap.

* * * * *